United States Patent
Batchelor et al.

(10) Patent No.: US 6,836,874 B2
(45) Date of Patent: Dec. 28, 2004

(54) SYSTEMS AND METHODS FOR TIME-BUDGETING A COMPLEX HIERARCHICAL INTEGRATED CIRCUIT

(75) Inventors: Dennis B. Batchelor, Fort Collins, CO (US); David James Mielke, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 71 days.

(21) Appl. No.: 10/180,632

(22) Filed: Jun. 26, 2002

(65) Prior Publication Data

US 2004/0003360 A1 Jan. 1, 2004

(51) Int. Cl.[7] .................................................. G06F 9/45

(52) U.S. Cl. ................... 716/6; 716/5; 716/10; 716/16

(58) Field of Search .............................. 716/1, 2, 3, 4, 716/5, 6, 7, 8, 9, 10–15, 17

(56) References Cited

U.S. PATENT DOCUMENTS

| | | | | |
|---|---|---|---|---|
| 5,859,776 A | * | 1/1999 | Sato et al. ................ | 700/121 |
| 6,230,304 B1 | * | 5/2001 | Groeneveld et al. .......... | 716/7 |
| 6,496,962 B1 | * | 12/2002 | Dalton ......................... | 716/6 |
| 2002/0124230 A1 | * | 9/2002 | Cai et al. ..................... | 716/6 |
| 2003/0014720 A1 | * | 1/2003 | Ito et al. ...................... | 716/6 |
| 2003/0121013 A1 | * | 6/2003 | Moon et al. ................. | 716/6 |

* cited by examiner

Primary Examiner—Vuthe Siek
Assistant Examiner—Binh Tat

(57) ABSTRACT

Systems and methods for time-budgeting an integrated circuit design are provided. A representative system includes an information acquisition device, a computer, and a memory element associated with the computer, the memory element configured to store the information and associate a timing point that accounts for signal delays between the border of a functional block and the various circuits within the block. A representative method includes the following steps: acquiring circuit information that describes the conductors that traverse a border of the functional block, inserting a timing point in the information, determining a delay time in response to the timing point, and deriving a constraint in response to the delay time.

12 Claims, 6 Drawing Sheets

SYSTEMS AND METHODS FOR TIME-BUDGETING A COMPLEX HIERARCHICAL INTEGRATED CIRCUIT

BACKGROUND OF THE INVENTION

1. Technical Field

The present invention generally relates to computer-aided integrated circuit design systems, and more particularly to systems and methods for accurately determining clock signal timing constraints when designing an integrated circuit.

2. Description of the Related Art

Integrated circuits are electrical circuits that arrange transistors, resistors, capacitors, and other components on a single semiconductor die or substrate, upon which the various components are interconnected to perform a variety of functions. Typical examples of integrated circuits include, for example, microprocessors, programmable-logic devices (PLDs), electrically-erasable-programmable-read-only memory devices (EEPROMs), random-access-memory (RAM) devices, operational amplifiers, voltage regulators, etc.

Often, circuit designs are simulated by computer to verify functionality and timing to ensure that performance goals will be satisfied. Design and circuit analysis procedures are often performed using electronic-computer-aided design (E-CAD) tools. The design and subsequent simulation of a printed circuit board, a very large scale integration (VLSI) circuit, or other electrical devices via E-CAD tools allows a product design to be confirmed and often eliminates the need for building a prototype. Thus, E-CAD tools may enable a VLSI circuit manufacturer to bypass costly and time consuming prototype construction and performance verification stages in the product development process.

A VLSI circuit design can be represented at different levels of abstraction using a hardware description language. Some hardware description languages support circuit description at a register-transfer level, as well as at a logic level.

At any abstraction level, a circuit design may be specified using behavioral or structural descriptions or a combination of both. A behavioral description is often specified using Boolean functions. A structural description may include a list describing the various connections in a network of primitive or higher-level cells. Such a list is often called a "netlist." The netlist may be used by logic synthesizers, circuit simulators, and other circuit design optimization tools to model the circuit. Examples of primitive cells are, among others, full-adders, logic gates, latches, and flip-flops. A register is an example of a higher-level (i.e., a non-primitive) cell.

A number of known systems use information provided in netlists to evaluate circuit timing and other related parameters. Although the operational specifics vary from system to system, generally such systems operate by identifying certain critical timing paths, modeling the conductors and the various cells defining each critical timing path using a resistor-capacitor (RC) network, and then evaluating the circuit to determine whether timing violations occur for signals required to traverse each of the critical paths. Static timing tools, a specific type of optimization tool, are used to confirm that received input signals will arrive in time for the receiving block to process the signals, and block output signals will reach their designated destination circuits before the next clock cycle. Static timing tools are designed with a focus on cell to cell (e.g., register to register) travel time estimates.

Unfortunately, this cell to cell approach is not well suited to convey useful and accurate timing information in the early design stages of a VLSI circuit. First, VLSI circuits are commonly designed by circuit design teams. Each circuit designer or a team of circuit designers are assigned to create the circuits that will be used in one or more functional areas or blocks across the die that will contain the entire circuit. In the final product, each of the separately designed functional blocks must function correctly over time while receiving input signals and sending output signals across functional block interfaces. This functional block by functional block design approach can lead to circuit timing flaws that may not be identified until the functional blocks are integrated.

In addition, these block level interface-timing problems increase as a function of clock signal frequency. As the clock signal frequency increases, the corresponding shorter clock cycles increase the relative impact of signal transfer delays between an interface of a functional block and the various circuit components (e.g., registers) contained within respective blocks. Thus, static timing tools, designed with the intention of confirming a circuit design, are not suited to generate timing information that can be communicated to the designers of each of the functional blocks before they finalize the details of their assigned block circuit designs. Moreover, timing tools do not provide a mechanism to convey block level to block level timing information for a multi-level integrated circuit design.

In light of competitive pressures to design functional VLSI circuits with confidence that functional blocks will operate as desired over time, while reducing the design life cycle and development costs, it can be understood that there is a need for systems and methods that address these and/or other shortcomings of the prior art, while providing a functional VLSI circuit design.

SUMMARY OF THE INVENTION

Systems and methods of the present invention relate to time budgeting the various functional blocks of an integrated circuit during circuit design. A time budget is a schedule that defines signal-timing relationships between various signal paths across an integrated circuit. The systems methods of the present invention can be applied to generate timing constraints at multiple levels of circuit abstraction. The systems and methods account for signal propagation delays between functional block interfaces including delays between hierarchically associated functional blocks. More specifically, the systems and methods of the present invention generate accurate timing constraints that may be used by circuit designers tasked with developing the various circuits within a functional block.

A representative system includes an information acquisition device, a computer, and a memory element associated with the computer, the memory element configured to store information used to describe a functional block and associate a timing point that accounts for signal delays between the border of the functional block and the various circuit elements within the block.

A representative method includes the following steps: acquiring circuit information that describes the conductors that traverse a border of the functional block, inserting a timing point in the information, determining a delay time in response to the timing point, and deriving a constraint in response to the delay time.

Other systems, methods, and features of the present invention will be or become apparent to one skilled in the art upon examination of the following drawings and detailed description. It is intended that all such additional systems, methods, and features are included within this description, are within the scope of the present invention, and are protected by the accompanying claims.

BRIEF DESCRIPTION OF THE DRAWINGS

The invention can be better understood with reference to the following drawings. The components in the drawings are not necessarily to scale relative to each other, emphasis instead is placed upon clearly illustrating the principles of the present invention. Moreover, in the drawings, like reference numerals designate corresponding parts throughout the several views.

DETAILED DESCRIPTION OF THE PREFERRED EMBODIMENT

Figure 1:
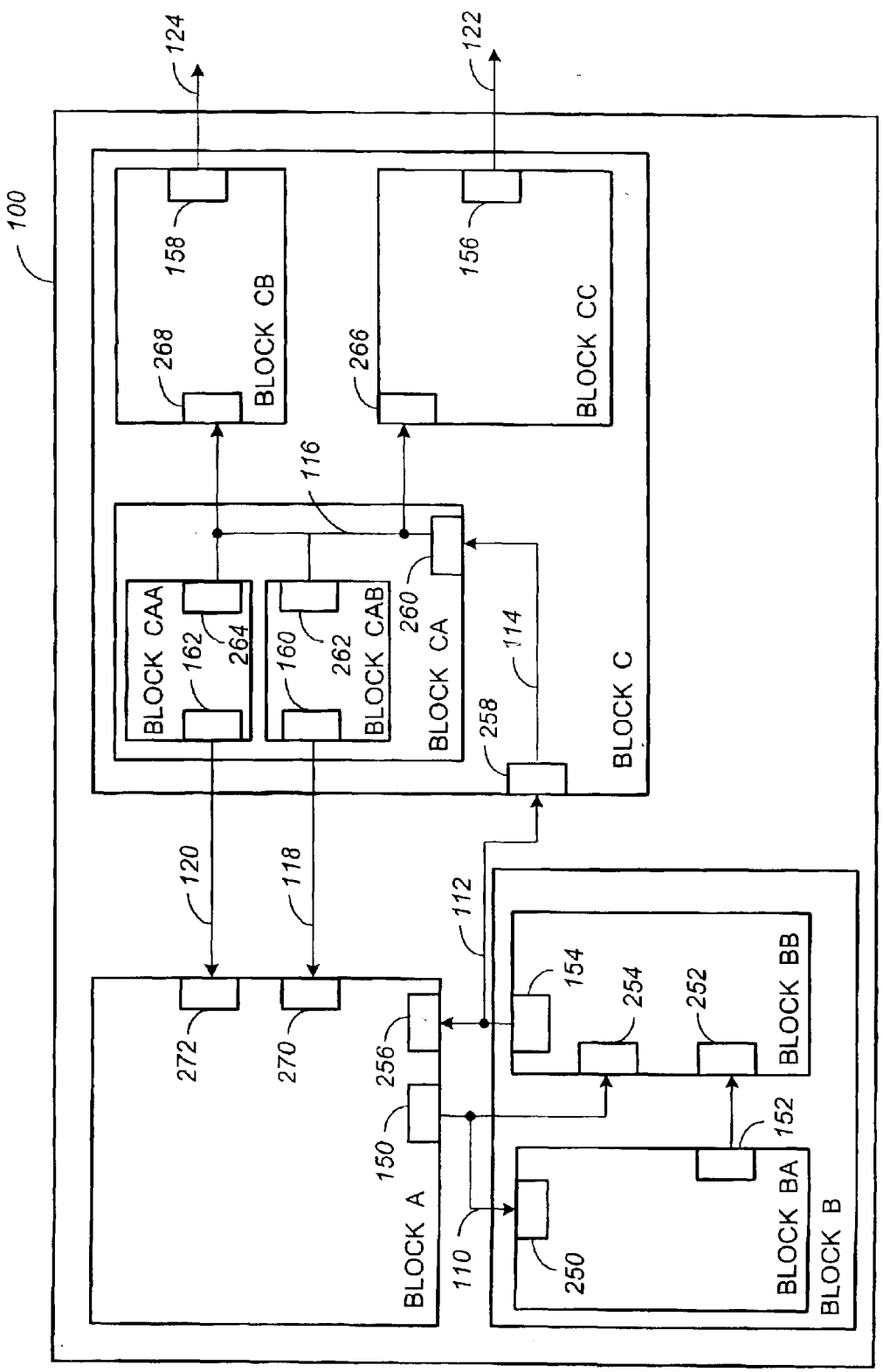
FIG. 1 is a block diagram of an integrated circuit that can be modeled and analyzed by embodiments of the invention.
Figure 2:
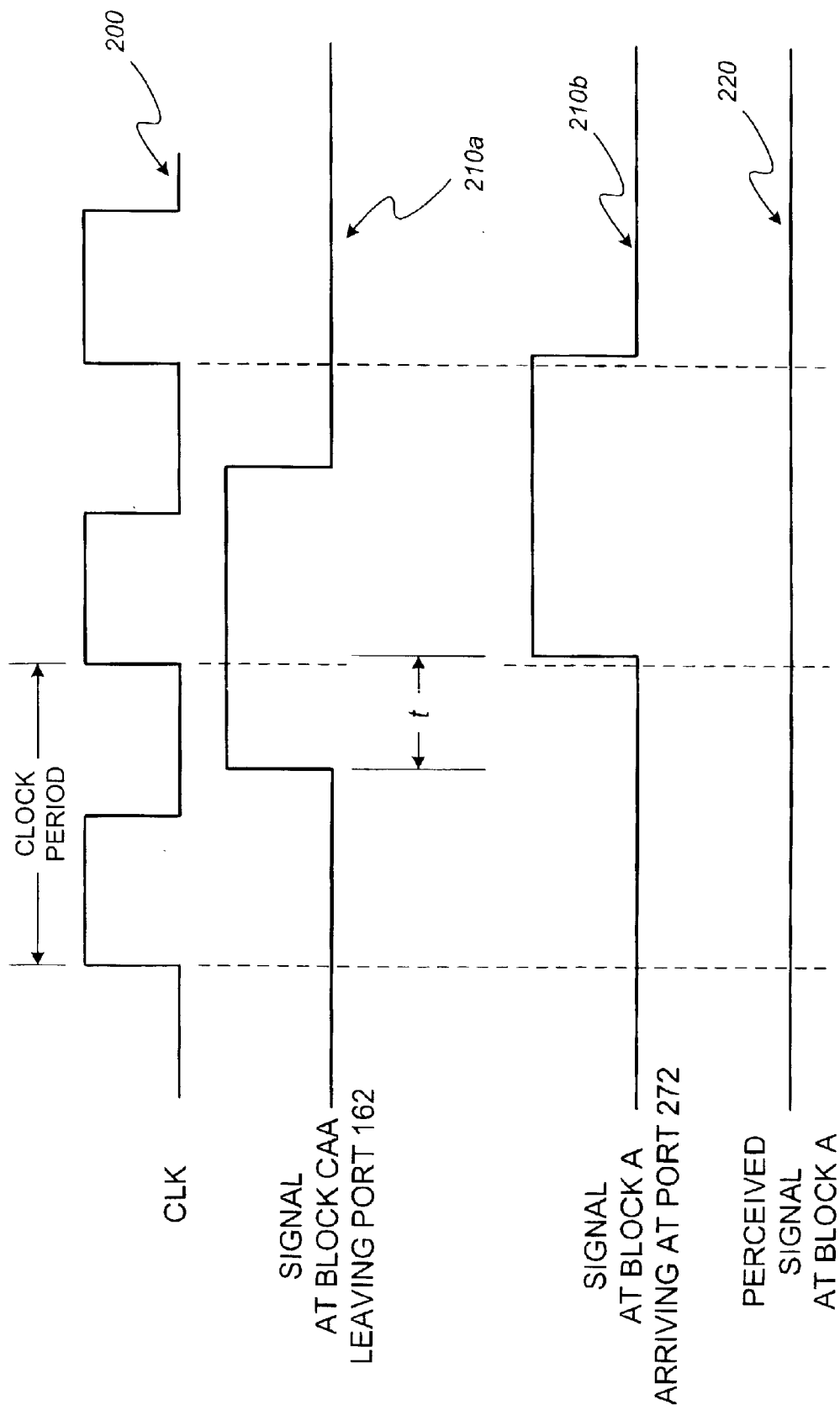
FIG. 2 is a schematic representation of a clock and a data signal from the integrated circuit of FIG. 1.

The block diagrams and schematic presented in FIGS. 1 and 2 are provided to illustrate and describe aspects of computer-aided circuit design pertinent to the present invention. In this regard, FIG. 1 shows that an integrated circuit may be arranged and modeled with a plurality of separately defined functional blocks arranged and coupled in a hierarchical fashion across the integrated circuit. FIG. 2 illustrates the importance of tightly coordinating the relative timing between clock and data signals across an integrated circuit.

FIG. 1 is a block diagram illustrating an integrated circuit representation 100 that may be generated in a computer-aided design tool. The integrated circuit representation 100 illustrated in FIG. 1 is grossly oversimplified for ease of illustration and discussion of aspects pertinent to the scope of the invention. It should be understood that VLSI circuits may contain tens to hundreds of millions of transistors and other various functional components. It should be further understood that an integrated circuit at that level of integration may be designed by individual circuit designers and/or by teams of circuit designers tasked with developing component arrangements to meet various functional and timing specifications. Thus, functional divisions or blocks may be assigned to various circuit designers or teams to design separate portions of the integrated circuit.

In this regard, the integrated circuit representation 100 includes circuit blocks labeled, A, B, and C. Circuit blocks A, B, and C may each contain circuitry configured to perform one or more designated functions for one or more time varying input signals. The circuit blocks A, B, and C may also be configured with appropriate conductors to forward output signals to each other and in some cases to destinations other than those on the integrated circuit 100. Circuit blocks A, B, and C are representative of a first level of the overall integrated circuit representation 100.

As shown in FIG. 1, circuit blocks B and C contain other circuit blocks. For example, circuit block B contains circuit blocks BA and BB. Circuit blocks BA and BB may be alternatively described as child blocks (of the parent level block B) or second-level blocks. In this regard, the child or second-level blocks BA and BB are hierarchically arranged above the first level of the integrated circuit 100. Circuit block C contains child or second-level blocks CA, CB, and CC. In addition, block CA further includes child or third-level-blocks CAA and CAB.

Circuit blocks may both receive and/or send time varying signals to or from other circuit blocks via various conductors. These input and output signals may traverse functional blocks at the same hierarchical level (e.g., the first, second, and third levels, respectively), as well as traverse different hierarchical levels (e.g., between the third and the first levels). For example, conductor 110 connects circuit block A with circuit block B at the first hierarchical level. Circuit block B is also coupled to circuit blocks BA and BB at the second hierarchical level. Conversely, conductor 120 connects circuit block CAA with circuit block A thus coupling the third hierarchical level to the first hierarchical level.

For simplicity of illustration and description, the integrated circuit representation 100 omits respective ports at the intersection of conductors and the border of each functional block at the each hierarchical levels. For example, ports are not illustrated at the intersection of block CA and block C. It should be understood, that each functional block can be modeled by the conductors (inputs and outputs) that traverse the border of the functional block at one or more hierarchical levels. In other words, conductor 118 may be modeled by adding both an input and an output port within block CA and an input and an output port within block C in addition to port 160 and port 270.

Furthermore, the integrated circuit representation 100 illustrates only three levels of hierarchy. It should be further understood that more or fewer levels of hierarchy are contemplated and may be modeled and analyzed in the contemplated system. Moreover, the contemplated system may be programmed to model and analyze each possible level to level interconnection, in a multi-level hierarchically arranged integrated circuit.

At one level of abstraction, circuit block A can be modeled or described by output port 150 and inputs ports 256, 270, and 272, and the various internal circuits (not shown) that may be coupled to the ports. As illustrated in FIG. 1, each of the separate ports 150, 256, 270, and 272 may be modeled at the interface of circuit block A. Similarly, circuit block B can be modeled by input port 250 and output port 154 and the various internal circuits (not shown) that may be coupled to the ports. In addition, circuit B can be modeled at a second level of abstraction that may account for output port 152, input ports 252 and 254, as well as the various internal circuits of blocks BA and BB, respectively. It should be understood that circuit block C, among other circuit blocks not illustrated, can be similarly represented at various levels of abstraction.

After each of the various circuit blocks A, B, and C have been appropriately modeled at a particular level of abstraction (i.e., level of interest), the integrated circuit representation 100 can be modeled by identifying and modeling each of the conductors that carry signals both to and from each of the circuit blocks. For example, circuit blocks A and B are connected between ports 150, 250, and 254 by conductor 110 and between ports 154 and 256 by conductor 112. Circuit blocks B and C are connected between ports 154 and 258 by conductor 112. Circuit blocks C and A are connected between ports 160 and 270 by conductor 118 and between ports 162 and 272 by conductor 120.

Circuit block C is configured to receive signals applied to conductor 112 at port 258. Conductor 114 couples port 258 to port 260 located within block CA. Conductor 116 couples port 260 to ports 262, 264, 266, and 268 located within circuit blocks CAB, CAA, CC, and CB, respectively. Circuit block CC provides a first output signal to one or more devices off the integrated circuit 100 via port 156 and conductor 122. Similarly, circuit block CB provides a second output signal via port 158 and conductor 124.

Reference is now directed to the timing diagram illustrated in FIG. 2. In this regard, each of the four signals illustrated in FIG. 2 represents a time-varying voltage signal that may be observed at the indicated locations within the integrated circuit representation 100 of FIG. 1. The uppermost time-varying signal 200 is representative of a clock signal that may be distributed to and throughout each of the functional blocks of the integrated circuit. For the purposes of this discussion, it is assumed that the clock distribution scheme applies the clock signal uniformly throughout the entire integrated circuit. Stated another way, it is assumed that for a circuit configured to respond to the leading edge of the clock signal that the leading edge arrives at each component across the integrated circuit at the same time.

Proceeding down the illustration, the next time-varying signal is a representative signal 210a observed exiting port 162 from circuit block CAA along conductor 120 (see FIG. 1). Thereafter, FIG. 2 shows the representative signal 210a as it might be observed at port 272 of circuit block A (see FIG. 1). Note that while the time-varying plots indicate that the general shape of the time-varying signal 210a that exits circuit block CAA will be the same when it arrives at circuit block A, the received signal is shifted by time, t, such that the signal arrives at a different relative position within the clock period. Note that for integrated circuits configured to trigger on a leading (i.e., rising) edge of a clock signal transition, the registered or perceived time-varying signal 210b at port 272 of circuit block A maybe interpreted as not varying over time as shown by the non-varying signal 220 perceived at port 272 of circuit block A.

Figure 3:
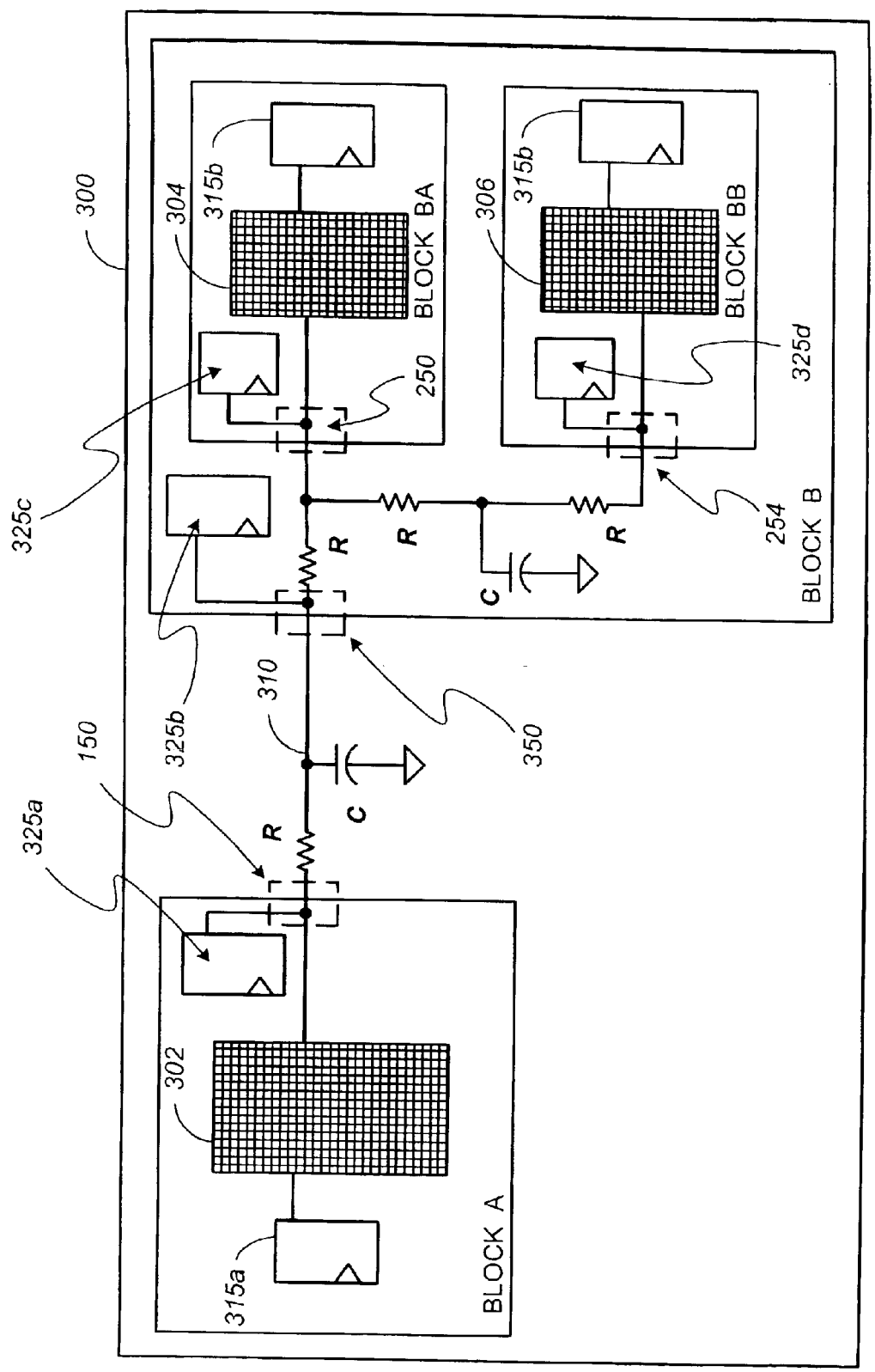
FIG. 3 is a block diagram of a model of a portion of the integrated circuit of FIG. 1.

Time, t, includes multiple components. These multiple components will be described in detail below with regard to the block diagram of FIG. 3. In this regard, FIG. 3 illustrates a model 300 of the integrated circuit representation 100 of FIG. 1, between circuit blocks A and B along conductor 310 (a model of conductor 110 as shown in FIG. 1). Circuit block A includes a source register 315a coupled to port 150 through circuitry 302. Similarly, circuit block BA includes a destination register 315b coupled to port 250 via circuitry 304. In addition, circuit block BB includes destination register 315b coupled to port 254 through circuitry 306.

As shown in FIG. 3, layout information identifying conductor geometry (i.e., the length and width of each line segment) can be applied to an integrated circuit model to establish expected signal travel times between each functional block border by determining expected relative signal arrival and departure times at respective port pairs along a conductor. For example, layout information can be used to determine the length, width, and depth of each of the multiple paths of conductor 310. Each of the paths can then be modeled with appropriate resistance and capacitance values in a resistor-capacitor (RC) network, such as the network illustrated in FIG. 3.

As illustrated in FIG. 3, sentry registers may be introduced in proximity to ports 150, 250, 254, and 350 (i.e., near the functional block borders) to facilitate the later determination of a plurality of expected signal delay times between specific ports along the conductor 310. For example, sentry register 325a may be used to determine an expected time interval that a signal that originates in source register 315a will use to traverse the border of circuit block A. Sentry register 325a may be modeled as if the register has a zero capacitance value. In this way, signal delay times will not be increased by adding the sentry register 325a to the model 300.

Sentry register 325b, in proximity to port 350, may be used to determine when the signal that originated in source register 315a of circuit block A can be expected to arrive at circuit block B. Sentry registers 325c and 325d located in proximity to ports 250 and 254, respectively, can be used to determine when the signal that originated in source register 315a of circuit block A can be expected to arrive at circuit blocks BA and BB, respectively. Thus, it should be understood that the model 300 provides a representation of internal processing time within an originating circuit block, a representation of signal delay time from the source circuit block to a destination circuit block, a signal delay time from the destination circuit block to higher level circuit blocks (e.g, blocks BA and BB), as well as an internal processing time within the ultimate destination circuit block.

Once a design team assigned to block BA receives an indication of when the signal that originated in source register 315a of circuit block A will arrive at circuit block BA (e.g., a timing constraint), the design team will be able to determine with greater certainty if the proposed design for circuitry 304 will result in the signal arriving at destination register 315b within the allotted time. The time at which the signal traverses the border of circuit block A relative to the clock cycle is important as it impacts integrated circuit functions in circuit blocks BA and BB. Relative clock cycle positions can be used as timing constraints for distribution across the various functional blocks of the integrated circuit representation 100.

Timing constraints can indicate to circuit design teams the amount of time a signal takes to propagate from block to block. The amount of time a signal takes to traverse from block to block can be used by design teams to determine when a particular input signal will be available at a functional block. In addition, the amount of time a signal takes to traverse from block to block can be used by design teams to determine when a particular output signal will be sent. Consequently, design teams can work within the timing constraints assigned to their particular functional block to finalize their portion of the overall integrated circuit design independently from other design teams with a higher greater probability that the overall circuit will function as intended.

For example, a timing constraint may include an indication of a point in time relative to a clock cycle at which a particular input signal will arrive at a circuit block port (e.g., port 350). Similarly, a timing constraint may include an indication of a point in time relative to a clock cycle at which a particular output signal should exit a circuit block port (e.g., port 150) such that the signal can be expected to arrive at each of its destinations at an appropriate time in the clock cycle.

Figure 4:
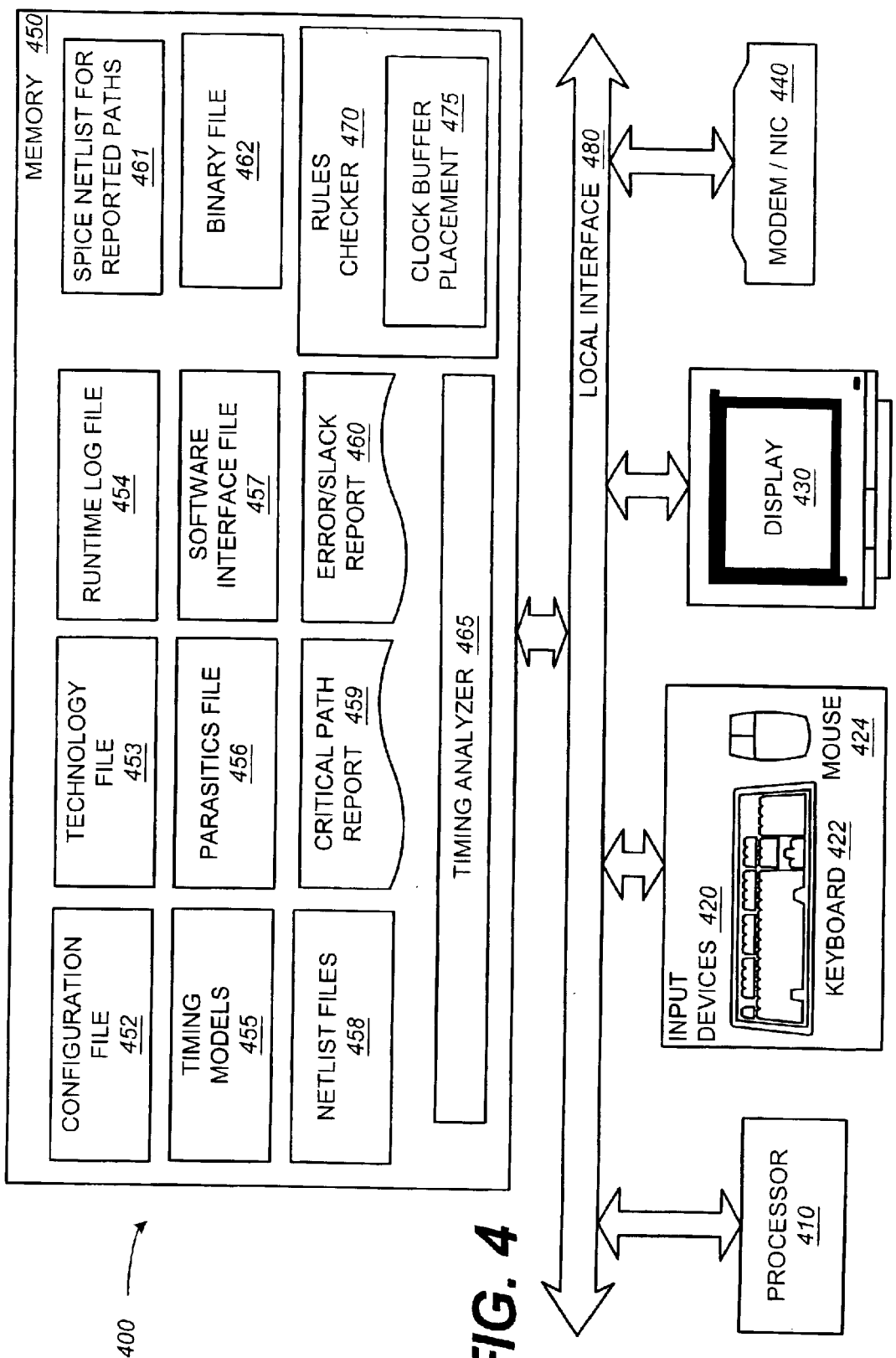
FIG. 4 is a block diagram illustrating an embodiment of a computing system that may be used to design and analyze the integrated circuit representations of FIGS. 1 and 3.

Reference is now directed to FIG. 4, which illustrates a functional block diagram of a general-purpose computer 400 that may be configured to produce one or more of the integrated circuit models illustrated and described in association with FIGS. 1 and 3. In this regard, the general-purpose computer 400 may include a processor 410, input devices 420, a display device 430, a network interface device 440, and a memory 450 that communicate with each other via a local interface 480. The local interface 480 can be, but is not limited to, one or more buses or other wired or wireless connections as is known in the art. The local interface 480 may have additional elements, such as buffers (caches), drivers, and controllers (omitted here for simplicity), to enable communications. Further, the local interface 480 includes address, control, and data connections to enable appropriate communications among the above-referenced components.

The processor 410 is a hardware device for executing software stored in memory 450. The processor 410 can be any custom made or commercially available processor, a central processing unit (CPU) or an auxiliary processor associated with the computer 400, and a semiconductor based microprocessor (in the form of a microchip) or a microprocessor. Examples of suitable commercially available microprocessors are as follows: a PA-RISC series microprocessor from Hewlett-Packard Company, an 80x86 or Pentium series microprocessor from Intel Corporation, a PowerPC microprocessor from IBM, a Sparc microprocessor from Sun Microsystems, Inc, or a 68xxx series microprocessor from Motorola Corporation.

The input devices 420 may include, but are not limited to, a keyboard 422, a mouse 424 among other interactive pointing devices, voice activated interfaces, or other suitable operator-machine interfaces (not shown for simplicity of illustration). The input devices 420 can also take the form of an image acquisition device (e.g., a scanner) or a data file transfer device (i.e., a floppy disk drive (not shown). Each of the various input devices 420 may be in communication with the processor 410 and/or the memory 450 via the local interface 480. Data received from an image acquisition device connected as an input device 420 or via the network interface device 440 may take the form of an image, a flat file, a database, or other various information transfer methodologies in addition to the aforementioned operator commands.

The display device 430 may include a video interface that supplies a video output signal to a display monitor associated with the computer 400. The display device(s) that can be associated with the computer 400 can be conventional CRT based displays, liquid crystal displays (LCDs), plasma displays, or other display types. It should be understood, that various output devices (not shown) may also be integrated via local interface 480 and/or via network interface device 440 to other well-known devices such as plotters, printers, etc.

Local interface 480 may also be in communication with input/output devices that connect the computer 400 to a network (not shown). These two-way communication devices include, but are not limited to, modulators/demodulators (modems), network interface cards (NIC), radio frequency (RF) or other transceivers, telephonic interfaces, bridges, and routers. For simplicity of illustration, such two-way communication devices are represented by modem/NIC 440.

The memory 450 can include any one or combination of volatile memory elements (e.g., random-access memory (RAM, such as dynamic RAM or DRAM, static RAM or SRAM, etc.)) and nonvolatile-memory elements (e.g., read-only memory (ROM), hard drive, tape drive, compact disc (CD-ROM), etc.). Moreover, the memory 450 may incorporate electronic, magnetic, optical, and/or other types of storage media. Note that the memory 450 can have a distributed architecture, where various components are situated remote from one another, but can be accessed by the processor 410.

The software in memory 450 may include one or more separate programs, files, reports, or logs. For example, the memory 450 may include a simulation program with integrated circuit emphasis or a simulation program with integrated circuit emphasis (SPICE) netlist for reported circuit paths 461 (e.g., conductors), a binary file 462, a timing analyzer 465, and a rules checker 470. Each of the one or more separate programs will comprise an ordered listing of executable instructions for implementing logical functions. Furthermore, the software in the memory 450 may include a suitable operating system (not shown). A non-exhaustive list of examples of suitable commercially available operating systems is as follows: a Windows operating system from Microsoft Corporation, a Netware operating system available from Novell, Inc., a UNIX operating system, which is available for purchase from many vendors, such as Hewlett-Packard Company and Sun Microsystems, Inc., or a LINUX operating system, which is available from Red Hat, Inc. The operating system essentially controls the execution of other computer programs, such as the timing analyzer 465, and provides scheduling, input-output control, file and data management, memory management, and communication control and related services.

It should be understood that the timing analyzer 465 can be implemented in software, firmware, hardware, or a combination thereof. The timing analyzer 465 in the present example, is a source program, executable program (object code), script, or any other entity comprising a set of instructions to be performed. When in the form of a source program, the timing analyzer 465 is translated via a compiler, assembler, interpreter, or the like, which may or may not be included within the memory 450, so as to operate properly in connection with the operating system. Furthermore, the timing analyzer 465 can be written as (a) an object-oriented programming language, which has classes of data and methods, or (b) a procedure-programming language, which has routines, subroutines, and/or functions, for example but not limited to, C, C++, Pascal, Basic, Fortran, Cobol, PERL, Java, and Ada. In the currently contemplated best mode of practicing the invention, the timing analyzer 465 is written in PERL.

In the representative general-purpose computer 400 illustrated in FIG. 4, the memory 450 includes configuration file 452, timing models 455, one or more netlist files 458, technology file 453, and a parasitics file 456, containing various input information. The critical path report 459, runtime log file 454, software interface file 457, and error/slack report 460 may also be found and/or generated and stored in memory 450. It will be understood by those skilled in the art that the actual implementation of the various configuration files 452, timing models 455 netlist files 458, technology files 453, parasitics file 456, as well as the critical path report 459, runtime log file 454, software interface file 457, and error/slack report 460 will vary based on the underlying technology being modeled and the requirements of various computer-aided design tools integrated with the general-purpose computer 400 to perform one or more circuit design steps.

It will be further appreciated that the software and/or firmware in memory 450 may also include a basic input output system (BIOS) (not shown). The BIOS is a set of essential software routines that test hardware at startup, launch the operating system, and support the transfer of data among hardware devices. The BIOS is stored in read-only memory and is executed when the general-purpose computer 400 is activated.

When the general-purpose computer 400 is in operation, the processor 410 executes software stored in memory 450, communicates data to and from memory 450, and generally controls operations of the coupled input/output devices pursuant to the software. The timing analyzer 465, the operating system, and any other applications are read in whole or in part by the processor 410, buffered by the processor 410, and executed.

When the timing analyzer 465 is implemented in software, as shown in FIG. 4, it should be noted that the timing analyzer 465 can be stored on any computer-readable medium for use by or in connection with any computer-related system or method. In the context of this document, a computer-readable medium is an electronic, magnetic, optical, or other physical device or means that can contain or store a computer program for use by, or in connection with a computer-related system or method. The computer-readable medium can be, for example but not limited to, an electronic, magnetic, optical, electromagnetic, infrared, or semiconductor system, apparatus, device, or propagation medium.

Operation

Figure 5:
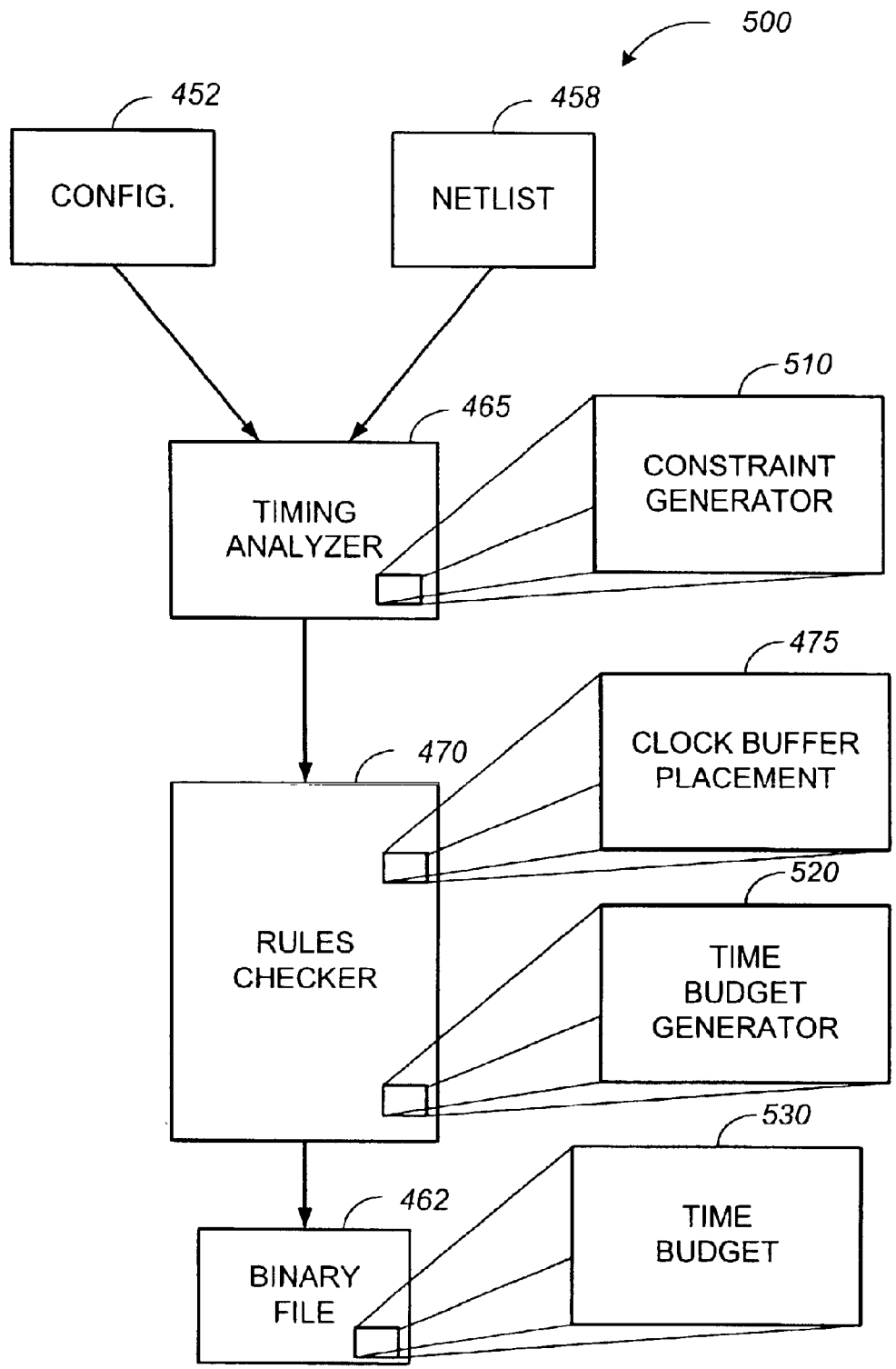
FIG. 5 is a functional block diagram illustrating a design process that can be implemented by the computing system of FIG. 4.

Reference is now directed to the functional block diagram of FIG. 5, which illustrates a representative design process 500 that can be implemented by the general-purpose computer 400 of FIG. 4. As illustrated in the design process 500, the timing analyzer 465 operative within the general-purpose computer 400 may be programmed to receive information from configuration file 452 and one or more netlist files 458 describing a present model of the contemplated VLSI circuit. The timing analyzer 465 may be programmed with a constraint generator 510. The constraint generator 510 receives relative timing information for signal interfaces as described above with regard to the representative circuit 300 illustrated and described FIG. 3. The constraint generator 510 applies the relative timing information to the identified interfaces conveyed in the configuration file 452 and the one or more netlists 458 to generate timing constraints that may be associated with each functional block of the contemplated circuit design. It should be understood that timing constraints may be generated and associated with each input signal that enters a functional block, as well as with each output signal that exits a functional block. The timing constraints which may be defined as a relative portion of a clock signal cycle may be stored in memory 450 (FIG. 4) and/or communicated to each of the identified functional block designers.

In addition, the timing constraints may be forwarded for application in a rules checker 470. The rules checker 470 may include logic configured to prevent a circuit designer and/or a circuit design team from storing a proposed circuit design that fails to meet one or more design criteria. Note that the design criteria applied by the rules checker 470 may include information regarding actual clock buffer placement throughout the contemplated circuit (in lieu of designing the circuit under the assumption that the clock signal reaches each functional block across the circuit at the same time). The rules checker 470 may also include a time budget generator 520. The time budget generator 520 may be configured to convert available time constraints into a schedule that describes signal-timing relationships at the functional block borders. The rules checker 470 will use the schedule created by the time budget generator 520 to add the signal timing relationships to the circuit model. An updated circuit model may be partially reflected in binary file 462. As illustrated in FIG. 5, the binary file 462 may include a time budget 530 for each representation of the various functional blocks throughout the contemplated circuit.

Figure 6:
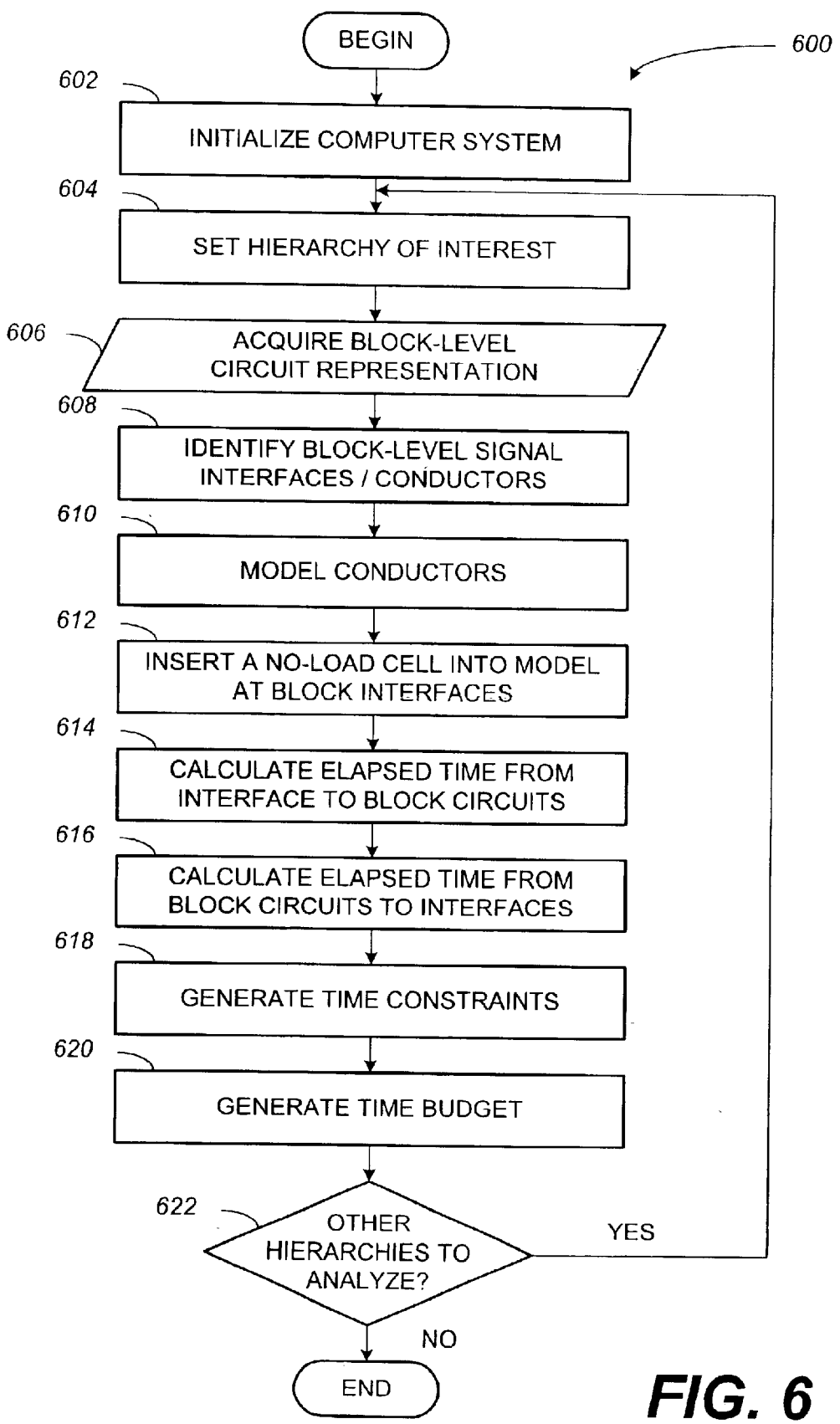
FIG. 6 is a flow diagram illustrating a representative method for generating timing constraints that can be applied to the integrated circuit of FIG. 1.

FIG. 6 is a flow diagram illustrating a representative method 600 for time budgeting an integrated circuit representation such as the integrated circuit representation 100 of FIG. 1. As illustrated in the flow diagram, a general-purpose computer 400 configured to implement the method 600 for time budgeting may begin by initializing the system. Step 602 may include loading a plurality of model (i.e., data) files. These files may include the configuration file 452, previously generated timing models 455, netlist files 458, technology file 453, and the parasitics file 456, among others. As described above, the plurality of data files are used to formulate a hierarchically arranged model of the various signal paths that associate the various functional blocks of the modeled circuit. Ultimately, the model will describe signal timing (relative to a clock signal) for each signal that traverses each of the defined functional blocks of the modeled circuit. For a hierarchically arranged circuit, the timing analyzer 465 (FIG. 4) is applied over the various hierarchical levels to establish the timing constraints that the circuit designers of functional blocks will use to ensure the intended operation of the circuit as a whole. The clock signal at each functional block may be modeled by information that includes the clock period and clock signal uncertainty. Additional information may include clock and data signal transition limits. Next, as shown in step 604, the general-purpose computer 400 may be programmed to prompt the user to set a hierarchy level of interest.

Parasitics may be defined in the parasitics file 456 for each net in the design. Parasitics include the set of resistance and capacitance values that may be applied to model various conductors used in the circuit design. A net is formed by the various conductors that integrate functional blocks at a specific hierarchical level in the circuit design. Parasitic annotations may be applied to the ports of the next higher-level functional blocks. To simplify the model, parasitic information is not necessarily added to functional blocks that are two or more hierarchical levels removed from a specific hierarchical level of interest.

Once the system has been initialized and the hierarchy level of interest identified in steps 602 and 604, the general-purpose computer 400 can acquire any previously designed and stored block-level circuit representations as indicated in step 606. Note that the block-level circuit representations can include models of various levels of abstraction including a previously completed circuit design. Thereafter, the general-purpose computer 400 can be programmed to identify signal interfaces for each functional block at the hierarchical level of interest as indicated in step 608. The general-purpose computer 400, having identified the signal interfaces, can then model the conductors that traverse the border of each functional block as shown in step 610.

Next, in step 612, the general-purpose computer 400 will insert a "no-load" cell into the model at functional block interfaces. A "no-load" cell is a representation of a circuit element that does not introduce a capacitive load on the functional circuitry within the functional blocks of the circuit design. For example, a sentry register 325 (FIG. 3) may be inserted at each input and output port of a particular functional block of interest. The insertion of the "no-load" cell (e.g., sentry register 325a) at the boundary of functional block A, allows the general-purpose computer 400 to calculate timing information for signals that travel from one functional block to one or more other functional blocks. The sentry register 325 may be added to a library for use as a library (i.e., a reference) cell or may be generated within timing analyzer 465 and represented as a leaf-level block. A leaf-level block is a circuit component with a single conductor coupled in the model to a conductor of interest.

In steps 614, the general-purpose computer 400 is programmed to calculate the expected travel times of input signals from the functional block border to the block level circuits associated with each particular input. Similarly, in step 616, the general-purpose computer 400 is programmed to calculate the expected travel times for each output signal generated within the functional block. Once these travel times are available, the general-purpose computer 400 determines the expected relative timing with respect to a clock signal for each of the input and output signals of each of the respective functional blocks at the hierarchical level of interest.

For example, each sentry register can be analyzed by determining an identifier, a host block identifier, a timing delay value, and an associated signal transition or slew rate. The sentry register identifier can be generated such that the hierarchy level can be determined from the identifier. Next, as indicated in step 618, timing constraints can be determined for each sentry register of each functional block as follows. A constraints file may be generated to store a constraint associated with each sentry register for each functional block. An expected delay time can be captured from the timing analyzer 465. The delay time can then be applied to the following algorithm to derive a required time (e.g., a time constraint).

If port is an input,
    required time=delay time
If port is an output,
    required time=clock period-delay time+ clock uncertainty Once the time constraints are generated they may be saved to a file, written to a report, and/or otherwise added to the model of the contemplated circuit.

A transition rate or slew rate for each signal can also be captured. The transition or slew rate determines the minimum rate at which the signal is required to transition in order for the calculated required time to be valid. It should be understood that transition rate signal delays compound as a signal is distributed throughout the various circuits. Whereas the signal transition rate can be expected to have little or no effect for relatively simple logic circuits (e.g., those with only a few circuit components) the signal transition rate can become troublesome in complex circuit designs, such as hierarchical designs where signals may be processed by circuitry in multiple functional blocks before the signal has reached all intended destination components.

Furthermore, a hold time may be calculated for each port. The hold time can be generated by identifying the fastest possible delay to the sentry register as determined by the timing analyzer 465. A hold time may be important as there is a portion of the clock cycle that the value of a signal at a receiving cell (e.g., a register) must remain stable for the receiving cell to accurately receive the desired signal.

In addition to the delay value, the timing analyzer 465 may also calculate a slack value for the conductor associated with each port of the functional block of interest. The slack value represents the amount of time the signal could arrive sooner at its destination and still meet timing requirements for the receiving register. The value for the minimum delay that the signal may arrive at the port is determined in the same manner as the delay time above, but the minimum arrival specification is calculated as follows:

If port is an input or an output,
    minimum arrival=delay time-slack/2

Note that the function described above for generating a minimum arrival is simplified for the purposes of illustration and description. If the conductor path were more complex than a driving register connected to a conductor devoid of feed-through paths, the slack term would be modified by a divisor larger than two (2). A feed-through path is a path that traverses a block input to a block output without a register stage. Another name for this type of path is a "snake path." After the time constraints are generated as indicated above, the various values associated with each port may be saved to constraint files associated with each respective functional block.

After the time constraints are generated and stored to the model as indicated in step 618, the general-purpose computer 400 may be programmed to integrate the constraints in a time budget as shown in step 620. As described above, a time budget is a schedule that describes signal-timing relationships at the functional block borders at the hierarchical level of interest. After having compiled the time budget for the present hierarchical level, the general-purpose computer 400 may be programmed to prompt an operator whether it is desired to analyze other hierarchical levels of the circuit representation. If the operator's response is affirmative, the general-purpose computer 400 may be programmed to repeat steps 604 through 620. Otherwise, when the operator's response is negative, the general-purpose computer 400 may be programmed to terminate the method 600 for time-budgeting the integrated circuit representation.

Any process descriptions or blocks in the flow diagram of FIG. 6 should be understood as representing modules, segments, or portions of code which include one or more executable instructions for implementing specific logical functions or steps in the process for time-budgeting an integrated circuit, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

The detailed description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A method for determining signal propagation delay in an integrated circuit representation, the method comprising the steps of:

acquiring circuit information, the circuit information comprising a plurality of functional blocks and a plurality of conductors coupling the functional blocks, wherein the functional blocks are modeled by the conductors that traverse a border of each of the functional blocks;

inserting a representation of a sentry register in the circuit information such that the register is proximal to the border of the functional block;

determining a delay time in response to the representation; and deriving a constraint in response to the delay time, wherein deriving a constraint comprises determining the source of a signal on the associated conductor, and wherein when the associated port carries an input signal, deriving the constraint comprises setting a constraint value to approximate the delay time.

2. The method of claim 1, wherein the circuit information comprises a relative position of the functional blocks.

3. The method of claim 1, wherein the circuit information comprises a plurality of ports, the ports defining a relative position of each of the conductors that traverse the border of a particular functional block.

4. The method of claim 1, wherein the representation of the register is coupled to a port.

5. The method of claim 1, wherein the representation of the register comprises a null capacitance value.

6. The method of claim 1, wherein one of the plurality of functional blocks comprises a child block.

7. The method of claim 6, the functional block defines a first hierarchical level and the child block defines a second hierarchical level.

8. The method of claim 7, further comprising: determining constraints at the first hierarchical level.

9. The method of claim 8, further comprising: determining constraints at the second hierarchical level.

10. The method of claim 1, further comprising: communicating the constraint.

11. The method of claim 10, further comprising: applying the constraint to a model of the functional block.

12. A method for determining signal propagation delay in an integrated circuit representation, the method comprising the steps of:

acquiring circuit information, the circuit information comprising a plurality of functional blocks and a plurality of conductors coupling the functional blocks, wherein the functional blocks are modeled by the conductors that traverse a border of each of the functional blocks;

inserting a representation of a sentry register in the circuit information such that the sentry register is proximal to the border of the functional block;

determining a delay time in response to the representation; and deriving a constraint in response to the delay time and a source of a signal on the associated conductor, wherein when the associated port carries an output signal, deriving the constraint comprises solving a function of delay time, a clock period, and a clock uncertainty.

* * * * *